(12) United States Patent
Madhira et al.

(10) Patent No.: US 11,853,251 B2
(45) Date of Patent: Dec. 26, 2023

(54) ON-DIE CHIP-TO-CHIP (C2C) LINK STATE MONITOR

(71) Applicant: QUALCOMM Incorporated, San Diego, CA (US)

(72) Inventors: Ramesh Krishnamurthy Madhira, San Jose, CA (US); Ibrahim Ouda, Austin, TX (US); Kaushik Roychowdhury, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/662,032

(22) Filed: May 4, 2022

(65) Prior Publication Data

US 2023/0359579 A1 Nov. 9, 2023

(51) Int. Cl.
*G06F 13/42* (2006.01)
*G06F 1/14* (2006.01)

(52) U.S. Cl.
CPC .......... *G06F 13/4282* (2013.01); *G06F 1/14* (2013.01); *G06F 2213/0026* (2013.01)

(58) Field of Classification Search
CPC . G06F 13/4282; G06F 1/14; G06F 2213/0026
See application file for complete search history.

(56) References Cited

U.S. PATENT DOCUMENTS

| | | | | |
|---|---|---|---|---|
| 2012/0203986 A1* | 8/2012 | Strasser | ................ | G06F 3/0688 711/158 |
| 2013/0051483 A1* | 2/2013 | Wyatt | ............... | H04L 25/03885 375/259 |
| 2013/0067127 A1* | 3/2013 | Hopgood | ............ | G06F 13/4282 710/104 |
| 2013/0079159 A1* | 3/2013 | Brosowske | ............. | F16D 31/06 464/27 |
| 2013/0132755 A1* | 5/2013 | Cooper | ................. | G06F 1/3206 713/323 |
| 2021/0025938 A1 | 1/2021 | Pöppe et al. | | |

(Continued)

OTHER PUBLICATIONS

International Search Report and Written Opinion—PCT/US2023/017577—ISA/EPO—dated Jul. 4, 2023.

(Continued)

*Primary Examiner* — Henry Tsai
*Assistant Examiner* — Harry Z Wang
(74) *Attorney, Agent, or Firm* — Muncy, Geissler, Olds & Lowe, P.C./QUALCOMM

(57) ABSTRACT

Disclosed are techniques for chip-to-chip (C2C) serial communications, such as communications between chiplets on a multi-chip package. In some aspects, a method of on-die monitoring of C2C links comprises detecting a change of the C2C link from a first link state to a second link state and storing link state change information in an on-die first-in, first-out (FIFO) buffer. The link state change information indicates the first link state, the duration of time the C2C link was in the first link state, and the speed of the C2C link in the first link state. Upon detecting a request for link state change information, link state change information is retrieved from the FIFO buffer and transmitted serially to an output pin of the die, such as a general purpose input/output (GPIO) pin.

16 Claims, 7 Drawing Sheets

(56) References Cited

U.S. PATENT DOCUMENTS

2021/0143972 A1\* 5/2021 Mann .................... H04L 69/323
2021/0173004 A1\* 6/2021 Perley .............. G01R 31/31705

OTHER PUBLICATIONS

Nejedlo J., et al., "IntelA IBIST, The Full Vision Realized", International Test Conference, IEEE, Piscataway, NJ, USA, Nov. 1, 2009, pp. 1-11, XP031581849, ISBN: 978-1-4244-4868-5, The whole document.

\* cited by examiner

ON-DIE CHIP-TO-CHIP (C2C) LINK STATE MONITOR

BACKGROUND OF THE DISCLOSURE

1. Field of the Disclosure

Aspects of the disclosure relate generally to computer chip design and particularly to chip-to-chip (C2C) communications, such as communications between chiplets on a multi-chip package.

2. Description of the Related Art

A chiplet is one part of a processing module that makes up a larger integrated circuit like a computer processor. Rather than manufacturing a processor on a single piece of silicon with the desired number of cores, chiplets allow manufacturers to use multiple smaller chips to make up a larger integrated circuit. Multiple chiplets working together in a single integrated circuit are known as multi-chip modules (MCMs). Chiplets are becoming popular in different market segments due to benefits that chiplets have over larger, monolithic chip, such as increased performance and higher wafer processing yields.

Chip-to-chip (C2C) communications, such as communications between chiplets on a multi-chip package, typically occur over conductive traces on or within the package substrate to which the chiplets or dies are attached. Die-to-die (D2D) communications are similar, and the term C2C will be used hereinafter to refer to either or both C2C and D2D. C2C link architectural implementation is influenced by peripheral component interconnect express (PCIE) physical and data link layers.

However, C2C or D2D links may have no external visibility for electrical or protocol analysis, which means that a protocol analyzer cannot be used, since the link traces are not visible on the chip package.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a method of on-die monitoring of chip-to-chip (C2C) serial link state includes detecting a change of a link state of the C2C serial link from a first link state to a second link state; storing, in an on-die first-in, first-out (FIFO) buffer, link state change information, the link state change information comprising information indicating the first link state, a duration of time that the C2C serial link was in the first link state, and a speed of the C2C serial link in the first link state; detecting a request for link state change information; retrieving link state change information from the FIFO buffer; and transmitting the link state change information serially to an output pin.

In an aspect, an apparatus for on-die monitoring of C2C serial link training status and link state includes a die, comprising: a C2C serial link circuit comprising: a physical layer configured to transmit and receive data via a C2C serial link according to a C2C communication protocol; a serial link state machine (SLSM) configured to perform link training of the C2C serial link; and a SLSM monitor coupled to the SLSM and configured to: detect a change of a link state of the C2C serial link from a first link state to a second link state; store, in an on-die FIFO buffer, link state change information, the link state change information comprising information indicating the first link state, a duration of time the C2C serial link was in the first link state, and a speed of the C2C serial link in the first link state; detect a request for link state change information; retrieve link state change information from the FIFO buffer; and transmit the link state change information serially to an output pin of the die.

In an aspect, an apparatus includes means for detecting a change of a link state of a C2C serial link from a first link state to a second link state; means for storing, in an on-die FIFO buffer, link state change information, the link state change information comprising information indicating the first link state, a duration of time that the C2C serial link was in the first link state, and a speed of the C2C serial link in the first link state; means for detecting a request for link state change information; means for retrieving link state change information from the FIFO buffer; and means for transmitting the link state change information serially to an output pin.

In an aspect, a non-transitory computer-readable medium storing computer-executable instructions that, when executed by an apparatus, cause the apparatus to: detect a change of a link state of a C2C serial link from a first link state to a second link state; store, in an on-die FIFO buffer, link state change information, the link state change information comprising information indicating the first link state, a duration of time that the C2C serial link was in the first link state, and a speed of the C2C serial link in the first link state; detect a request for link state change information; retrieve link state change information from the FIFO buffer; and transmit the link state change information serially to an output pin.

In an aspect, the information of C2C link states, comprising the actual state of the state machine, the validity of the state, and the speed of the link, is output on a general purpose input/output (GPIO) pin, which can be monitored using a logic analyzer. In this manner, the C2C link states of both of the link partners can be monitored simultaneously.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

Figure 1:
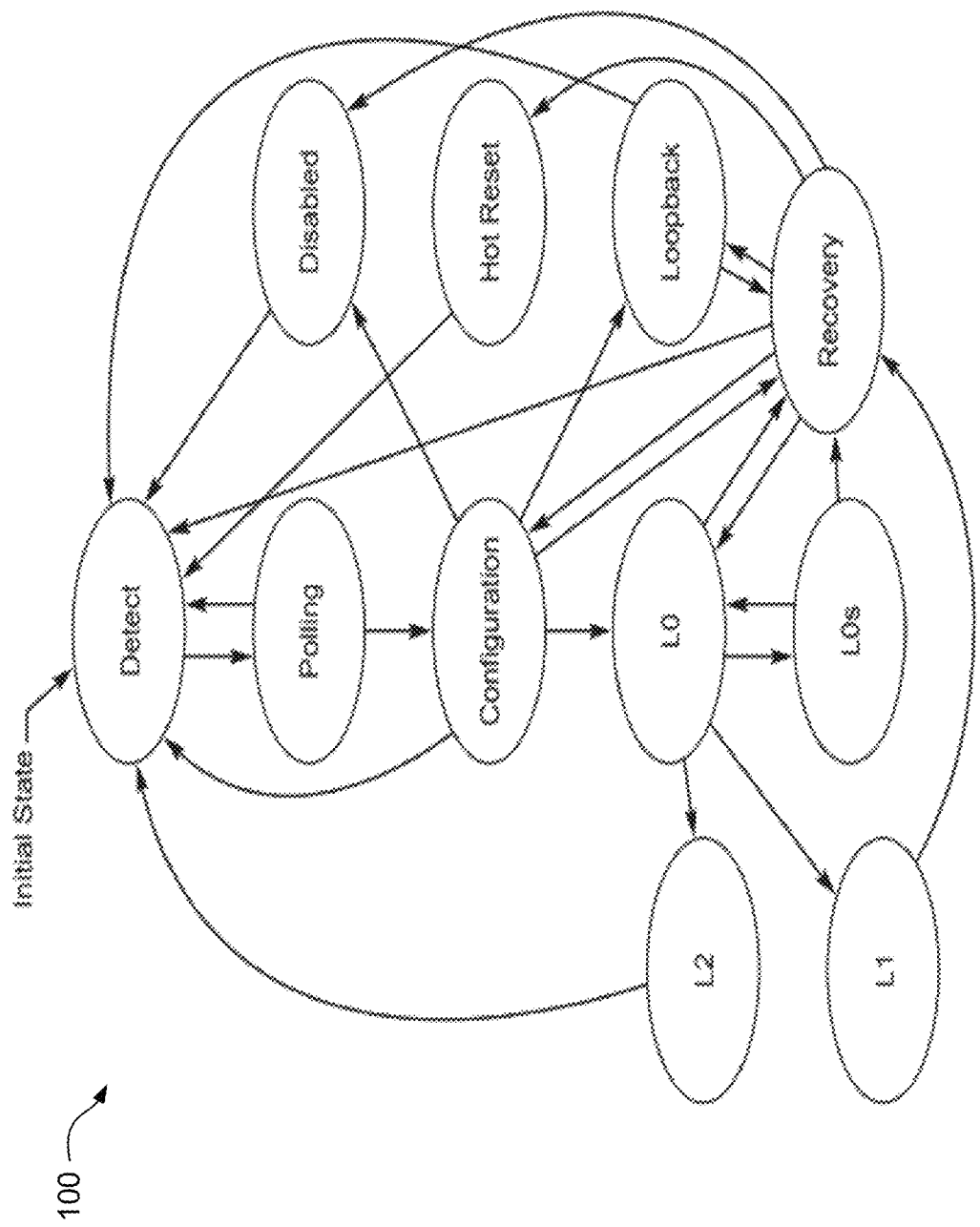
FIG. 1 illustrates the top-level states of a serial link state machine (SLSM), and specifically, a PCIE link training status and state machine (LTSSM).

Disclosed are techniques for chip-to-chip (C2C) serial communications, such as communications between chiplets on a multi-chip package. In some aspects, a method of on-die monitoring of C2C links comprises, at an on-die C2C link circuit for communicating via a C2C link according to a C2C protocol, detecting a change of the C2C link from a first link state to a second link state and storing link state change information in an on-die first-in, first-out (FIFO) buffer. The link state change information indicates the first link state, the duration of time the C2C link was in the first link state, and the speed of the C2C link in the first link state. Upon detecting a request for link state change information, link state change information is retrieved from the FIFO buffer and transmitted serially to an output pin of the die, such as a general purpose input/output (GPIO) pin.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

A chiplet is one part of a processing module that makes up a larger integrated circuit like a computer processor. Rather than manufacturing a processor on a single piece of silicon with the desired number of cores, chiplets allow manufacturers to use multiple smaller chips to make up a larger integrated circuit. Multiple chiplets working together in a single integrated circuit are known as multi-chip modules (MCMs). Chiplets are becoming popular in different market segments due to benefits that chiplets have over larger, monolithic chip, such as increased performance and higher wafer processing yields.

Chip-to-chip (C2C) communications, such as communications between chiplets on a multi-chip package, typically occur over conductive traces on or within the package substrate to which the chiplets or dies are attached. Die-to-die (D2D) communications are similar, and the term C2C will be used hereinafter to refer to either or both C2C and D2D. In some aspects, C2C link architectural implementation is influenced by peripheral component interconnect express (PCIE) physical and data link layers.

FIG. 1 illustrates the top-level states of a serial link state machine (SLSM), and specifically, a PCIE link training status and state machine (LTSSM) 100. The LTSSM states are defined by the PCIE specification. The LTSSM state machine and the PCIE protocol are used herein as an illustrative example of how serial communication between link partners may be implemented, and is not limiting: the same principles described herein may be applied to other protocols and to other state machines.

Referring now to PCIE LTSSM as an illustrative example, the top-level states include Detect, Polling, Configuration, L0, L0s, L1, L2, Recovery, Loopback, Hot Reset, and Disabled. Each state consists of substates that, taken together, comprise that state. The first LTSSM state after a reset is the Detect state. Detect, Polling, and Configuration are link training states; Recovery is a link re-training state; L0, L1, and L2 are power management states; L0s is an active power management state, as is L1. Loopback, Hot Reset, and Disabled are other states.

Table 1 lists LTSSM substates as defined in the PCIE Specification. The substates' numerical assignments are implementation dependent and included as an illustration of possible implementation. The numerical value is a six bit hexadecimal number.

TABLE 1

| LTSSM substates for PCIE |
|---|
| Detect Substates |
| 00: Detect.Quiet<br>01: Detect.Active |
| Polling Substates |
| 02: Polling.Active<br>03: Polling.Compliance<br>04: Polling.Configuration |
| Configuration Substates |
| 05: Configuration.Linkwidth.Start<br>06: Configuration.Linkwidth.Accept<br>07: Configuration.Lanenum.Wait<br>08: Configuration.Lanenum.Accept<br>09: Configuration.Complete<br>0A: Configuration.Idle |
| Recovery Substates |
| 0B: Recovery.RcvrLock<br>0C: Recovery.RcvrCfg<br>0D: Recovery.Speed<br>0E: Recovery.Idle<br>10: Recovery.Equalization.Phase0<br>11: Recovery.Equalization.Phase1<br>12: Recovery.Equalization.Phase2<br>13: Recovery.Equalization.Phase3 |

TABLE 1-continued

LTSSM substates for PCIE

L0 Substates

0F: L0

L0s Receiver Substates

14: Rx_L0s.Entry
15: Rx_L0s.Idle
16: Rx_L0s.FTS

L0s Transmitter Substates

17: Tx_L0s.Entry
18: Tx_L0s.Idle
19: Tx_L0s.FTS

L1 Substates

1A: L1.Entry
1B: L1.Idle

L2 Substates

1C: L2.Idle
1D: L2.TransmitWake

Loopback Substates

1E: Loopback.Entry
1F: Loopback.Active
20: Loopback.Exit

The PCIE states listed in Table 1 illustrate the point that high speed serial protocols may have the characteristic that the protocol starts at a low rate of speed on the serial link initially, then uses a state-based handshake mechanism to reach the highest data rate achievable under the current conditions, where the specific states and the order of state transitions is defined by the protocol. In some cases, the protocol may define a minimum time that a device must remain in a particular state before being allowed to go to the next state. In some case, the protocol may define a maximum time that a device may remain in a particular state before entering an error recovery state.

High speed, multi-gigabit interfaces, which are critical to product functionality and reliability, are extremely complex and challenging. Numerous registers have to be tuned for optimal performance, and probing the serial link state machine is required for link bring-up, link debug, diagnostics and link training optimization. Serial link state monitoring, which can be used to isolate power supply, system, thermal noise, or design sensitivity issues, will also be needed for failure diagnosis in customer premises. There is a need to monitor the link speed as well as the underlying serial link state machine state and sub-state transitions and the time spent in each state, which has a direct impact on total initialization time, thereby influencing system throughput.

However, C2C or D2D links may have no external visibility for electrical or protocol analysis, which means that a protocol analyzer cannot be used, since the link traces are not visible on the chip package. Complex and expensive on-chip debug logic setup would be required if implemented as an alternative.

Figure 2:
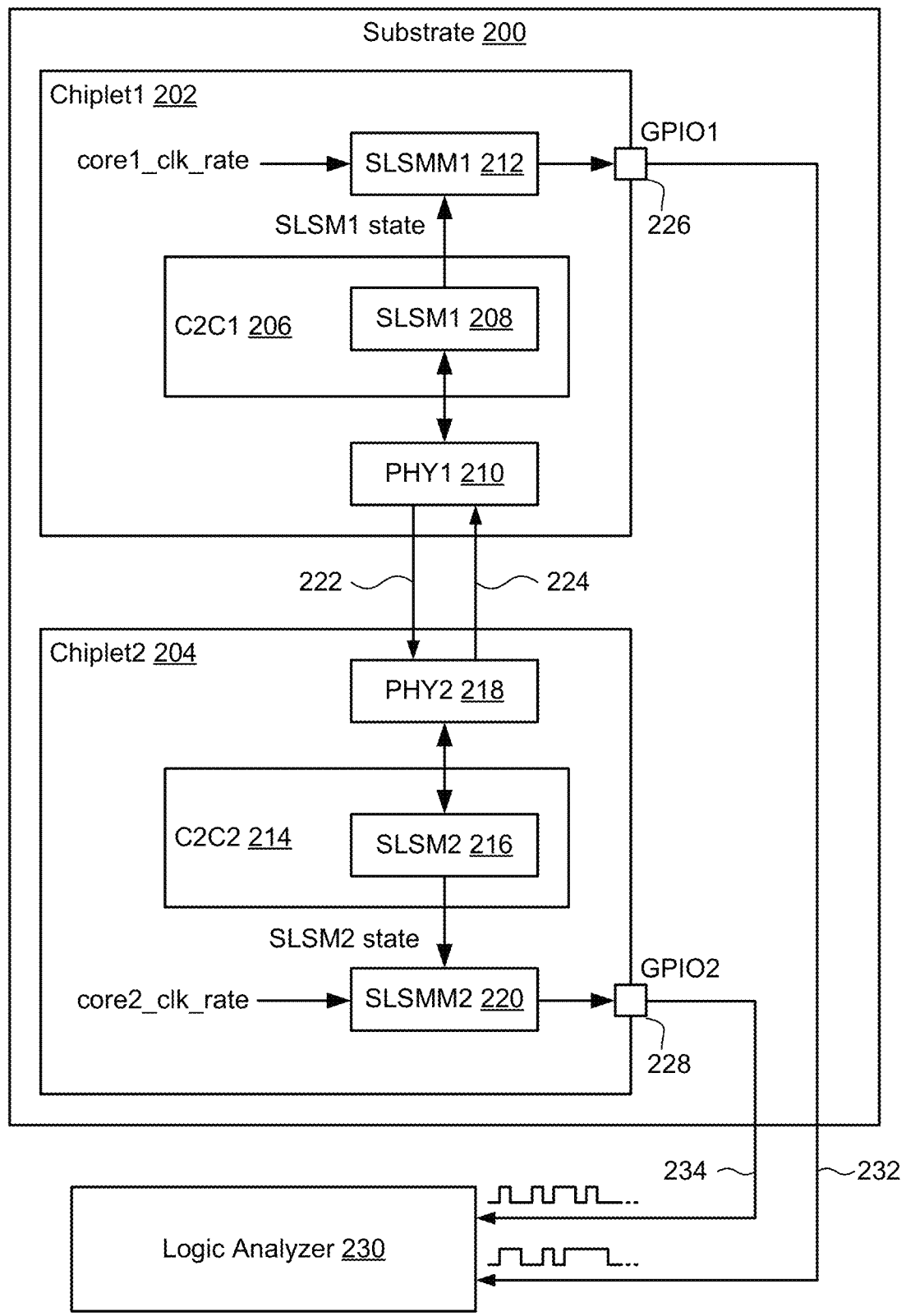
FIG. 2 illustrates chip-to-chip (C2C) communication using an on-die C2C SLSM monitor (SLSMM), according to aspects of the disclosure.

FIG. 2 illustrates a C2C implementation having an on-die SLSM monitor, along with the block diagram of the SLSM monitor logic, according to aspects of the disclosure. In FIG. 2, upon a substrate 200 are mounted two chiplets, chiplet1 202 and chiplet2 204. Chiplet1 202 includes a first C2C serial transceiver, C2C1 206, which is coupled to a first physical layer circuit, PHY1 208. C2C1 206 includes a first SLSM circuit, SLSM1 210. C2C1 206 also includes a first SLSM monitor, SLSMM1 212, for monitoring the SLSM1 210. Chiplet2 204 includes a second C2C serial transceiver, C2C2 214, which is coupled to a second physical layer circuit, PHY2 216. C2C2 214 includes a second SLSM circuit, SLSM2 218. C2C2 214 includes a second SLSM monitor, SLSMM2 220220, for monitoring the SLSM2 218. In some aspects, SLSM1 210 and SLSM2 218 may be PCIE LTSSMs, and SLSMM1 212 and SLSMM2 220 may be LTSSM monitors. In some aspects, the C2C link may be the same as or similar to PCIE, and the examples disclosed herein may reflect this similarity, but it is noted that the same principles may be applied to C2C links of other protocols.

Chiplet1 202 and chiplet2 204 communicate with each other via a C2C link using conductive traces 222 and 224 on, or embedded within, the substrate 200. Conductive traces 222 and 224 provide electrical connections between PHY1 212 and PHY2 220. The C2C link itself is not visible at the chip package and fully contained within the substrate. The SLSM monitors are used to provide the link state, link speed and the time spent in each state for both sides of the link partners using only 2 general purpose input/output ports (GPIOs). In FIG. 2, SLSMM1 212 outputs this information on GPIO1 226 and SLSMM2 220 outputs this information on GPIO2 228. This feature is vital to link bring-up, link debug and link optimization.

The respective SLSM circuits maintain the C2C link training status and current state for their respective chiplets. For brevity of description, the operation of only one of the SLSM monitors will be described, but it is noted that the other SLSM monitor would perform the same functions for the other chiplet.

Referring to C2C1 206 on chiplet1 202, the SLSM1 210 provides the current link state to the SLSMM1 212. The SLSMM1 212 also knows the core clock rate for chiplet1 202, core1 clk rate. The SLSMM1 212 thus maintains a running list of what state the SLSM1 210 was in and how long the SLSM1 210 was in each state, in terms of number of core clock cycles. Upon request, the SLSMM1 212 can provide that information to an entity outside of the chiplet1 202, e.g., via the GPIO1 226. Likewise, the SLSMM2 220 maintains the same kind of information about the SLSM2 218, and can provide that information to an entity outside of the chiplet2 204, via GPIO2 228. In some aspects, this information may be provided in the unique form disclosed in more detail below, but other formats for providing such information are also within the scope of the present disclosure and are aspects thereof.

In this manner, the state of the C2C link between chiplet1 202 and chiplet2 204 can be made visible for monitoring and/or analysis outside of chiplet1 202 and chiplet2 204, such as by a logic analyzer 230 (or other type of C2C link monitoring equipment) that analyzes the states of SLSM1 210 and SLSM2 218 by processing the serial output data 232 received from GPIO1 226 and the serial output data 234 received from GPIO2 228, respectively. In some aspects, the logic analyzer 230 may be part of another chiplet that is mounted to the substrate 200. In some aspects, the logic analyzer 230 may be a piece of bench test equipment that is electrically connected to the substrate 200 only for test and debug purposes. These examples are illustrative and not limiting; other implementations of the logic analyzer 230 are contemplated by the present disclosure.

Analysis of the serial output data 232 from SLSMM1 212 and the serial output data 234 from SLSMM2 220 allows the logic analyzer 230 to monitor and debug both partners of the embedded C2C serial link simultaneously (e.g., one partner per GPIO) and in real time or near real time. For clarity, FIG. 2 does not show details about triggering the SLSMM1 212 or SLSMM2 220 to output the serial output data 232 and serial output data 234, respectively, but in some aspects the serial output data may be output in response to an external request (e.g., from the logic analyzer 230) or in response to an internal trigger (e.g., as soon as it is available, in which case the logic analyzer 230 may monitor the serial output data for bit sequence that indicates the start of a serial output data sequence, for example). Other triggering modes are also contemplated by the present disclosure.

Figure 3:
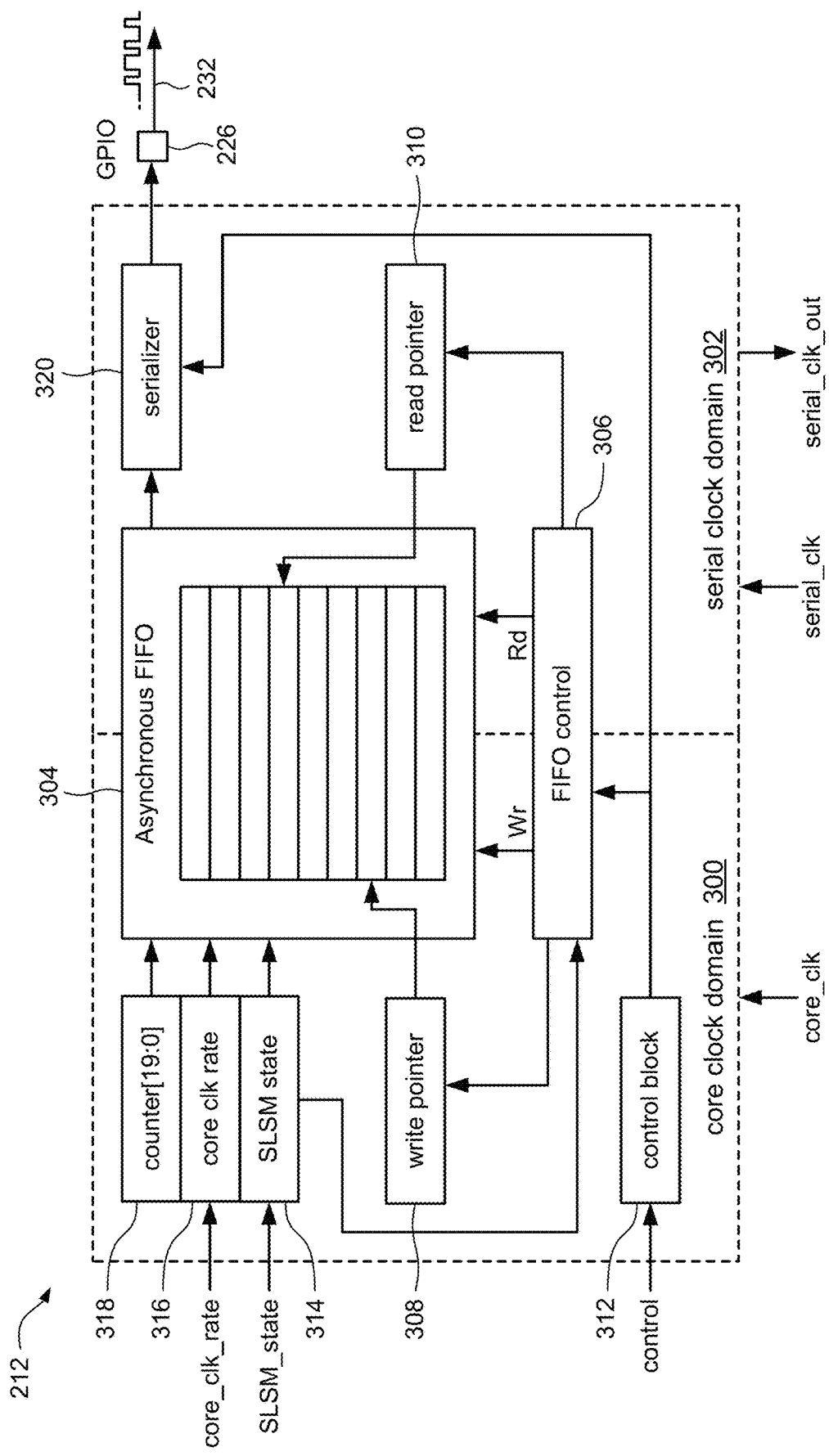
FIG. 3 illustrates in more detail an example C2C SLSMM according to aspects of the disclosure.

FIG. 3 illustrates in more detail an example SLSM monitor according to aspects of the disclosure. In the example illustrated in FIG. 3, the SLSM monitor SLSMM1 212 is divided into two clock domains, a core clock domain 300 and a serial clock domain 302. An asynchronous first-in, first-out (FIFO) buffer 304 operates in both clock domains. The main function of the SLSMM1 212 is to monitor the SLSM for the C2C link (e.g., SLSM1 210 in FIG. 2) and serially output the state along with the number of cycles spent in each state to a GPIO, e.g., GPIO 226. In some aspects, the SLSMM1 212 includes a FIFO control block 306 for controlling the asynchronous FIFO 304. The FIFO control block 306 manages a write pointer 308 and a read pointer 310 as well as a write control signal (Wr) and a read control signal (Rd). A control block 312 controls the SLSMM1 212.

Core clock domain. In some aspects, the core clock domain 300 stores information indicating the current state of the SLSM (SLSM state) 314 and information indicating the core clock rate (core clk rate) 316, and keeps track of how long the SLSM remained in that current state, e.g., using a counter 318. In some aspects, the core clock domain 300 starts monitoring when it is enabled, e.g., via a control signal received by the control block 312, and at least one of the following conditions is satisfied: the SLSM state changes to non-zero value; or the SLSM state equals to specific state and the logic is configured to trigger at the specific state. In some aspects, once triggered, the core clock domain 300 will count the number of core clock cycles spent in the current state. In some aspects, the core clock domain stores the core clock rate, current SLSM state and the number of cycles spent in the state to asynchronous FIFO 304. In some aspects, the asynchronous FIFO 304 is designed to accommodate SLSM state changes for a typical link training scenarios. In case of SLSM state changes more frequently which may cause the asynchronous FIFO 304 to be full, status to indicate this error condition will be stored to be sent out in the serial output.

Asynchronous FIFO. In some aspects, the asynchronous FIFO 304 writes the data at core clock frequency. In some aspects, the asynchronous FIFO 304 provides a "FIFO full" flag to the write control logic to eliminate overwriting valid data. In some aspects, the asynchronous FIFO 304 reads data when valid data is available at the serial clock frequency. In some aspects, the asynchronous FIFO 304 provides "FIFO empty" flag to the read control logic to indicate availability of valid data. In some aspects, the read data is provided to a serializer 320, which serially transmits the valid data out via the GPIO.

Serial clock domain. In some aspects, the serial clock domain 302 reads valid data from the asynchronous FIFO 304 when available and outputs it via GPIO 226. In some aspects, the data read from the asynchronous FIFO 304 includes the SLSM state and number of cycles in the state. In some aspects, the serializer 320 serializes the data at the serial clock frequency. In some aspects, e.g., where the C2C is based on PCIE and the SLSM is the PCIE LTSSM, the serial clock domain 302 sends the serial data to GPIO as 32 bits in the following format:

| Bit(s) | 31 | 30:28 | 27:26 | 25:20 | 19:0 |
|---|---|---|---|---|---|
| Field | Valid | PCIE gen rate | Status | LTSSM state/substate | Core clock cycle count | where the core clock cycle count refers to the number of core clock cycles were spent in each LTSSM state or substate. In some aspects, when the SLSM or core clock rate stays unchanged for long duration, the logic will force the serial output with the number of clock cycles set to the configurable maximum value and continue the count using the next entry in the asynchronous FIFO 304. Some examples of serial output are shown in FIGS. 4A-4C.

Figure 4A:
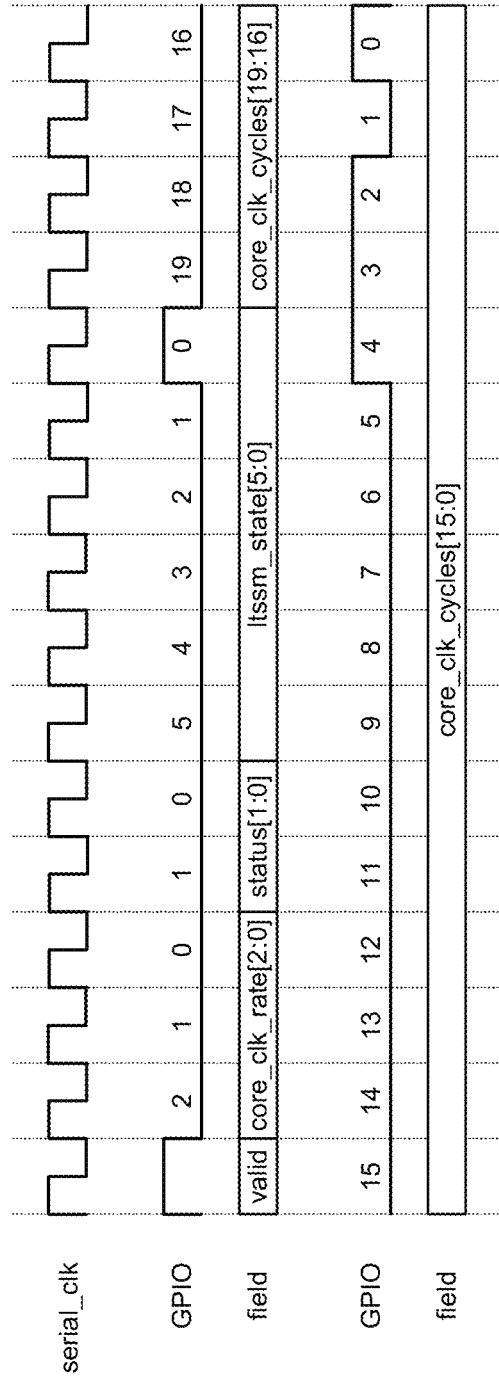
FIG. 4A, FIG. 4B, and FIG. 4C are figures that each illustrate an example C2C SLSMM serial output, according to aspects of the disclosure.
Figure 4B:
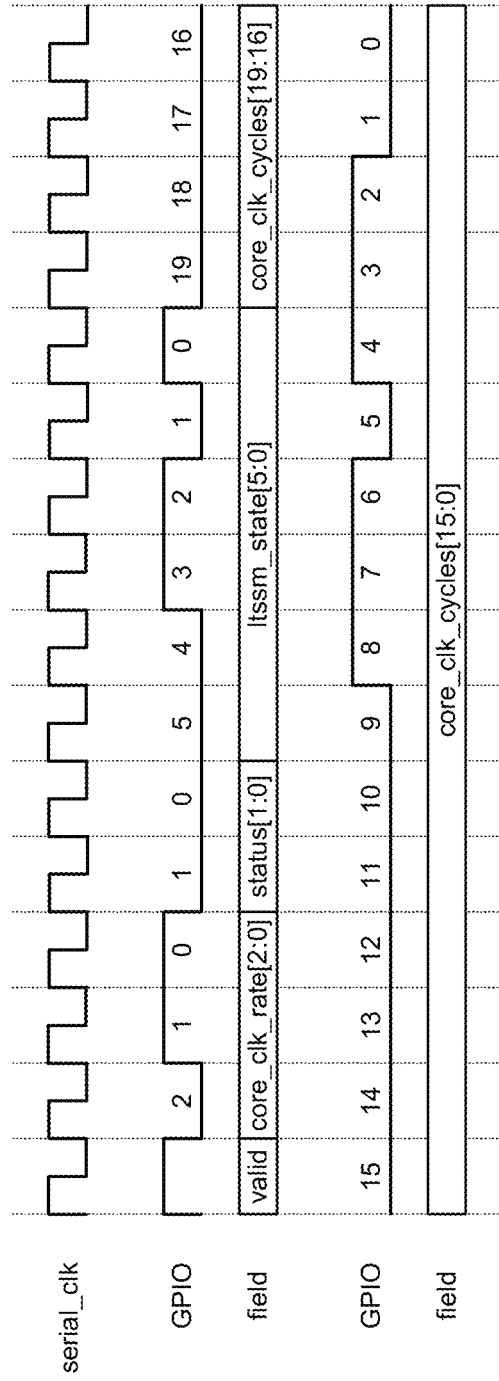
Figure 4C:
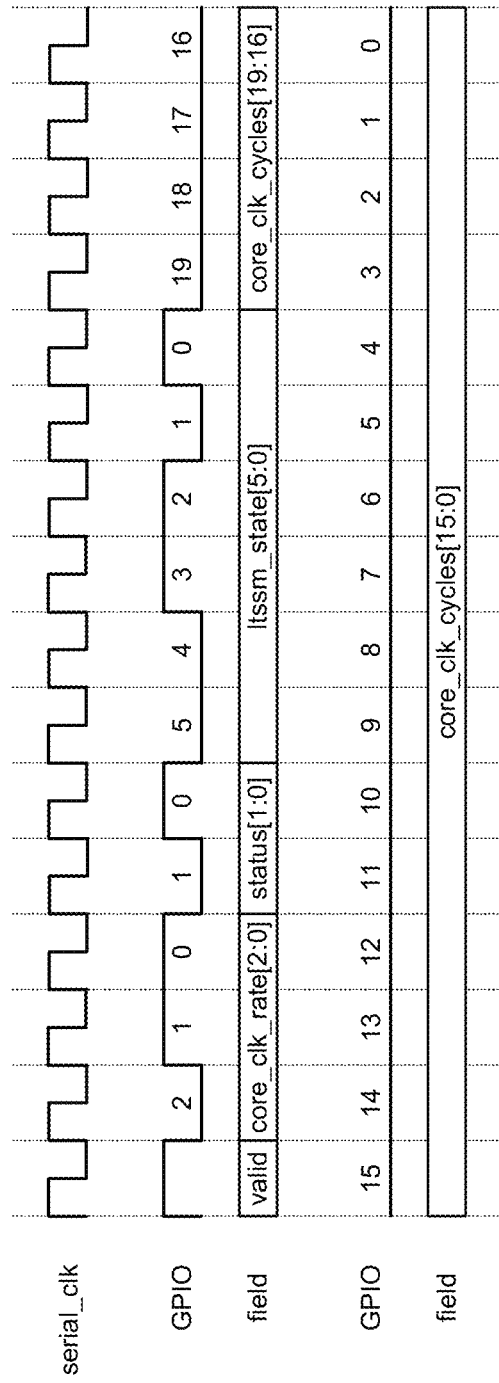

FIG. 4A, FIG. 4B, and FIG. 4C are figures that each illustrate an example SLSM monitor serial output, using an example format for serially presenting SLSM state machine information, according to aspects of the disclosure. In the examples shown in FIGS. 4A-4C, the C2C link is based on PCIE and uses the PCIE LTSSM state machine, but the same principles may be applied to other C2C serial protocols. The counter values shown in FIGS. 4A-4C are illustrative and not limiting; actual counter values will typically be higher values than the examples shown in FIGS. 4A-4C.

FIG. 4A shows an example SLSM monitor serial output indicating an example LTSSM state transition at gen 1 speed. The bits of the core_clk_rate field={000}, which indicates a core clock rate of 62.5 MHz. The bits of the status field={00}, which indicates OK (e.g., not error or overflow has occurred). The bits of the ltssm_state field={000001}, which indicates the Detect.Active substate. The bits of the core_clk_cycles field={00000000000000011101}, which indicates 29 cycles.

FIG. 4B shows an example SLSM monitor serial output of a clock rate transition to gen 4 speed. The bits of the core_clk_rate field={011}, which indicates a core clock rate of 500 MHz. The bits of the status field={00}, which indicates OK (e.g., not error or overflow has occurred). The bits of the ltssm_state field={001101}, which indicates the Recovery.Speed substate. The bits of the core_clk_cycles field={00000000000111011100}, which indicates 476 cycles.

FIG. 4C shows an example SLSM monitor serial output of an overflow condition. When an overflow condition occurs, the state counter will be forced to 0. The bits of the core_clk_rate field={011}, which indicates a core clock rate of 500 MHz. The bits of the status field={01}, which indicates that an overflow occurred. The bits of the ltssm_state field={001101}, which indicates the Recovery.Speed substate. Because of the overflow condition, the bits of the core_clk_cycles field are all set to zero.

In some aspects, the serial output may be captured with an analyzer on both link partners. This data can be then post-processed to provide visibility into the link initialization and training. Several examples of post-processed serial output for two link partners, Partner 0 and Partner 1, are shown in the following tables. These examples are for illustration only, and are intended to show example LTSSM state or substate transitions as seen from each end of an example C2C link based on PCIE, although the same principles may be applied to C2C links and state machines that use protocols other than PCIE. The time values are chosen to be illustrative and do not necessarily reflect real link training values.

Table 2 shows post-processed output from a first example of monitoring a C2C link between Partner 0 and Partner 1. Table 2 shows an example in which each partner is able to establish a unidirectional link at a first link speed, Gen1, then increase the link speed to a second link speed, Gen4. The time taken for each of these steps (i.e., the number of clock cycles during which the link remained in each respective state or substate) is roughly the same for both partners.

TABLE 2

| | Partner 0 | | | Partner 1 | | |
|---|---|---|---|---|---|---|
| # | Link Speed | LTSSM substate | Clock cycles | Link Speed | LTSSM substate | Clock cycles |
| 1 | Gen1 | L0 | 128 | Gen1 | L0 | 105 |
| 2 | Gen1 | Recovery.RcvrLock | 30 | Gen1 | Recovery.RcvrLock | 30 |
| 3 | Gen1 | Recovery.RcvrSpeed | 212 | Gen1 | Recovery.RcvrSpeed | 198 |
| 4 | Gen4 | Recovery.RcvrSpeed | 198 | Gen4 | Recovery.RcvrSpeed | 128 |
| 5 | Gen4 | Recovery.RcvrLock | 40 | Gen4 | Recovery.RcvrLock | 32 |
| 6 | Gen4 | Recovery.RcvrEq.Ph0 | 1024 | Gen4 | Recovery.RcvrEq.Ph0 | 1998 |
| 7 | Gen4 | Recovery.RcvrEq.Ph1 | 803 | Gen4 | Recovery.RcvrEq.Ph1 | 750 |
| 8 | Gen4 | Recovery.RcvrEq.Ph2 | 2011 | Gen4 | Recovery.RcvrEq.Ph2 | 1994 |
| 9 | Gen4 | Recovery.RcvrEq.Ph3 | 512 | Gen4 | Recovery.RcvrEq.Ph3 | 541 |
| 10 | Gen4 | Recovery.RcvrLock | 40 | Gen4 | Recovery.RcvrLock | 40 |
| 11 | Gen4 | Recovery.RcvrCfg | 48 | Gen4 | Recovery.RcvrCfg | 50 |
| 12 | Gen4 | Recovery.Idle | 98 | Gen4 | Recovery.Idle | 95 |
| 13 | Gen4 | L0 | MaxVal | | L0 | MaxVal |

Of particular note is the time spent at Gen1 speed (state #3 in Table 2) before the link was able to change to Gen4 speed (state #4 in Table 2). In the example above, the link stayed at Gen1 for about 200 clock cycles before transitioning to Gen4.

Table 3 shows the post-processed output from a second example of monitoring a C2C link involving the two partners.

TABLE 3

| | Partner 0 | | | Partner 1 | | |
|---|---|---|---|---|---|---|
| # | Link Speed | LTSSM substate | Clock cycles | Link Speed | LTSSM substate | Clock cycles |
| 1 | Gen1 | L0 | 128 | Gen1 | L0 | 105 |
| 2 | Gen1 | Recovery.RcvrLock | 30 | Gen1 | Recovery.RcvrLock | 30 |
| 3 | Gen1 | Recovery.RcvrSpeed | 4325 | Gen1 | Recovery.RcvrSpeed | 198 |
| 4 | Gen4 | Recovery.RcvrSpeed | 198 | Gen4 | Recovery.RcvrSpeed | 128 |
| 5 | Gen4 | Recovery.RcvrLock | 40 | Gen4 | Recovery.RcvrLock | 32 |
| 6 | Gen4 | Recovery.RcvrEq.Ph0 | 1024 | Gen4 | Recovery.RcvrEq.Ph0 | 1998 |
| 7 | Gen4 | Recovery.RcvrEq.Ph1 | 803 | Gen4 | Recovery.RcvrEq.Ph1 | 750 |
| 8 | Gen4 | Recovery.RcvrEq.Ph2 | 2011 | Gen4 | Recovery.RcvrEq.Ph2 | 1994 |
| 9 | Gen4 | Recovery.RcvrEq.Ph3 | 512 | Gen4 | Recovery.RcvrEq.Ph3 | 541 |
| 10 | Gen4 | Recovery.RcvrLock | 40 | Gen4 | Recovery.RcvrLock | 40 |
| 11 | Gen4 | Recovery.RcvrCfg | 48 | Gen4 | Recovery.RcvrCfg | 50 |
| 12 | Gen4 | Recovery.Idle | 98 | Gen4 | Recovery.Idle | 95 |
| 13 | Gen4 | L0 | MaxVal | | L0 | MaxVal |

In this example, partner 0 remains at Gen1 speed for 4325 clock cycles (state #3 in Table 3) before transitioning to Gen4 speed, while partner 1 is able to change to Gen4 speed after the usual 200 clock cycles or so. The longer time taken to change to Gen4 speed suggests that the phase locked loop (PLL) of partner 0 is taking longer to lock at the new speed. With this knowledge, the developer or debugger may determine that the PLL control registers should be tweaked to speed up the lock process. Without this knowledge, the developer or debugger may have little to no indication that there is an optimization that could be made in the link establishment process.

Table 4 shows the post-processed output from a third example of monitoring a C2C link involving the two partners.

TABLE 4

| | Partner 0 | | | Partner 1 | | |
|---|---|---|---|---|---|---|
| # | Link Speed | LTSSM sustate | Clock cycles | Link Speed | LTSSM substate | Clock cycles |
| 1 | Gen1 | L0 | 128 | Gen1 | L0 | 105 |
| 2 | Gen1 | Recovery.RcvrLock | 30 | Gen1 | Recovery.RcvrLock | 30 |
| 3 | Gen1 | Recovery.RcvrSpeed | 4325 | Gen1 | Recovery.RcvrSpeed | 198 |
| 4 | Gen4 | Recovery.RcvrSpeed | 198 | Gen4 | Recovery.RcvrSpeed | 128 |
| 5 | Gen4 | Recovery.RcvrLock | 40 | Gen4 | Recovery.RcvrLock | 32 |
| 6 | Gen4 | Recovery.RcvrEq.Ph0 | 1024 | Gen4 | Recovery.RcvrEq.Ph0 | 1998 |
| 7 | Gen4 | Recovery.RcvrEq.Ph1 | 803 | Gen4 | Recovery.RcvrEq.Ph1 | 750 |
| 8 | Gen4 | Recovery.RcvrEq.Ph2 | 2011 | Gen4 | Recovery.RcvrEq.Ph2 | 71325 |

TABLE 4-continued

|  | Partner 0 | | | Partner 1 | |
|---|---|---|---|---|---|
| # | Link Speed | LTSSM substate | Clock cycles | Link Speed | LTSSM substate | Clock cycles |
|---|---|---|---|---|---|---|
| 9 | Gen4 | Recovery.RcvrEq.Ph3 | 512 | Gen4 | Recovery.RcvrEq.Ph3 | 541 |
| 10 | Gen4 | Recovery.RcvrLock | 40 | Gen4 | Recovery.RcvrLock | 40 |
| 11 | Gen4 | Recovery.RcvrCfg | 48 | Gen4 | Recovery.RcvrCfg | 50 |
| 12 | Gen4 | Recovery.Idle | 98 | Gen4 | Recovery.Idle | 95 |
| 13 | Gen4 | L0 | MaxVal | Gen4 | L0 | MaxVal |

In this example, partner 0 remains at Gent speed for 4325 clock cycles (state #3 in Table 4) before transitioning to Gen4 speed, while partner 1 is able to change to Gen4 speed after the usual 200 clock cycles or so, suggesting again that the PLL control registers on partner 0 should be tweaked to speed up the lock process. In addition, however, the table above indicates that partner 1 is taking much longer for the receiver equalization phase 3 (state #8 in Table 4) than is partner 0. This suggests that the default transmit equalization settings on partner 0 are not optimal for signal reception by partner 1.

Figure 5:
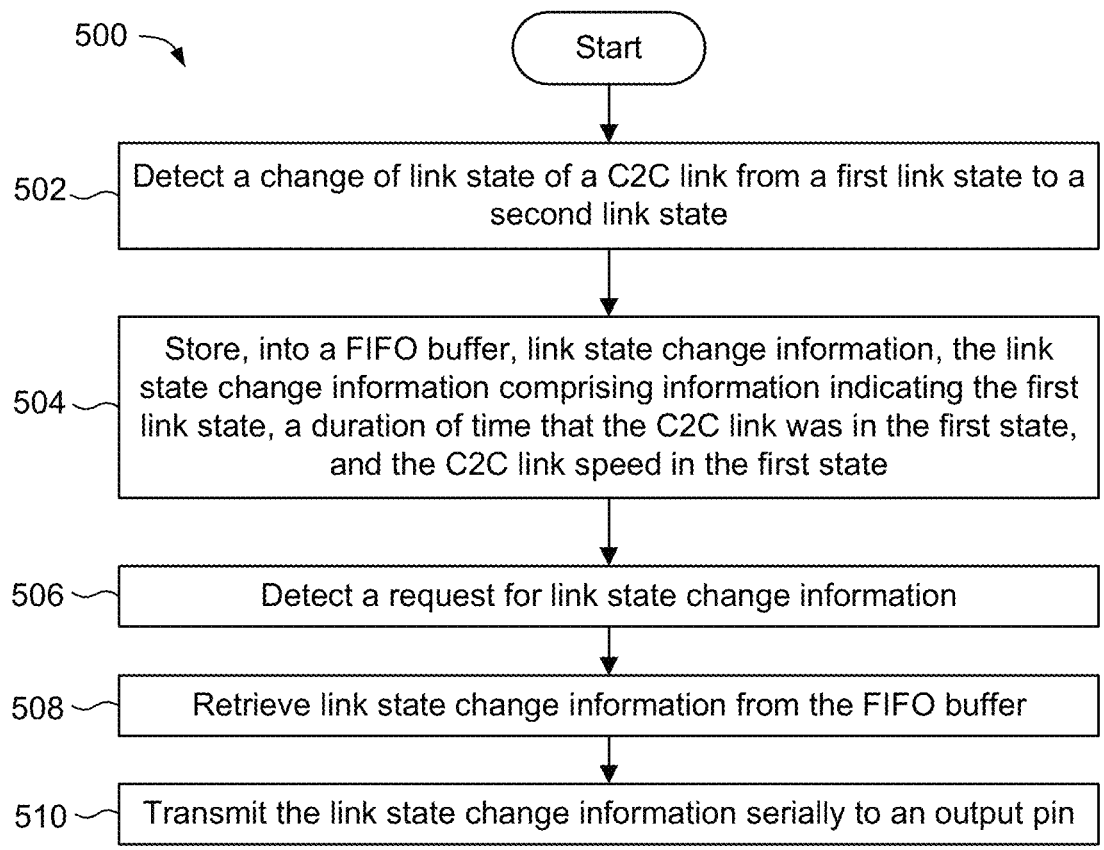
FIG. 5 is a flowchart showing a portion of an example process associated with an on-die C2C SLSMM, according to aspects of the disclosure.

FIG. 5 is a flowchart showing portions of an example process 500 associated with an on-die C2C link state monitor, according to aspects of the disclosure. In some implementations, one or more process blocks of FIG. 5 may be performed by a C2C link circuit (e.g., the C2C serial transceiver 206, SLSMM1 212). In some implementations, one or more process blocks of FIG. 5 may be performed by another device or a group of devices separate from or including the C2C link circuit. Additionally, or alternatively, one or more process blocks of FIG. 5 may be performed by one or more components of an apparatus, such as a processor(s), memory, or transceiver(s), any or all of which may be means for performing the operations of process 500.

As shown in FIG. 5, process 500 may include, at block 502, detecting a change of a link state of the C2C link from a first link state to a second link state. Since a change of link state of the C2C serial link is reflected by the SLSM, a change of link state corresponds to a change of SLSM state. In some aspects, means for performing the operation of block 502 may include an on-die C2C link circuit for communicating via a C2C link according to a C2C protocol, such as C2C serial transceiver 206. For example, the SLSMM1 212 may receive a notification of a new SLSM state from the SLSM1 210. In some aspects, detecting the change of link state of the C2C link comprises detecting the change of the link state of a peripheral component interconnect express (PCIE) protocol link.

As further shown in FIG. 5, process 500 may include, at block 504, storing, in an on-die first-in, first-out (FIFO) buffer, link state change information. Means for performing the operation of block 504 may include the C2C serial transceiver 206. For example, the SLSMM1 212 may receive the SLSM state from the SLSM1 210 and, before storing it in SLSM state 314, may create an entry in the asynchronous FIFO 304 that includes the previous value in SLSM state 314 and the current value in the counter 318. Once that information is stored into the asynchronous FIFO 304, e.g., by the FIFO control block 306, the write pointer 308 is updated, the counter 318 is cleared, and the received SLSM state is stored in SLSM state 314. Thus, in some aspects, the link state change information may comprise information indicating the first link state, a duration of time that the C2C link was in the first link state, and a speed of the C2C link in the first link state.

In some aspects, storing information indicating the first link state comprises storing information indicating a PCIE LTSSM state or substate. In some aspects, storing information indicating the duration of time the C2C link was in the first link state comprises storing information indicating how many clock cycles the C2C link was in the first link state.

As further shown in FIG. 5, process 500 may include, at block 506, detecting a request for link state change information. Means for performing the operation of block 506 may include the SLSMM1 212. For example, such a request may be received by the control block 312.

As further shown in FIG. 5, process 500 may include, at block 508, retrieving link state change information from the FIFO buffer. Means for performing the operation of block 508 may include the SLSMM1 212. For example, the control block 312 may trigger the FIFO control block 306 to instruct the asynchronous FIFO 304 to send the oldest entry (pointed to by the read pointer 310) to the serializer 320 and update the read pointer 310.

As further shown in FIG. 5, process 500 may include, at block 510, transmitting the link state change information serially to an output pin. Means for performing the operation of block 510 may include the SLSMM1 212. For example, the serializer 320 may then serially output the state change information received from the asynchronous FIFO 304 via the GPIO 226.

In some aspects, transmitting the link state change information serially to the output pin comprises transmitting at least one of one or more bits indicating the that serial output is valid, one or more bits indicating a core clock rate, one or more bits indicating a status of the link state change information, one or more bits indicating a link state, or one or more bits indicating a duration of time that the C2C link was in the link state.

Process 500 may include additional implementations, such as any single implementation or any combination of implementations described below and/or in connection with one or more other processes described elsewhere herein. Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The on-die SLSM monitor disclosed herein has a number of technical advantages. For example, in conventional multi-chip modules the link partners cannot be accessed because they are embedded in the substrate, but the on-die SLSM monitor provides a capability to monitor the link transitions, after post-processing the serialized state data.

Because the C2C link operates at a very high rate, it is not possible to simply provide an electrical connection directly to the conductive traces over which the link operates without causing an unacceptable degradation in link performance due to the additional impedance, inductance, and noise associated with an electrical connection out to an observable package pin. Even presuming that those technical challenges can be overcome, there still remains the issue that analysis of the C2C link signal so obtained would require an expensive protocol analyzer.

In contrast, the on-die SLSM monitor disclosed herein preprocesses the link data to provide real-time status updates, which occur at a much lower rate than the data rate of the C2C link itself. As a result the information can be provided by the SLSM monitor via a GPIO pin or other output pin at a lower clock rate, i.e., that can easily be accommodated by an observable package pin. Because the SLSM monitor disclosed herein provides a summary of activity on the link, e.g., identifying what states the link entered and how long the link stayed in each state, this eliminates a portion of post-processing that an external protocol analyzer would have needed to do, which simplifies the analysis of the data that is being output by the SLSM monitor on a GPIO pin.

Moreover, the on-die SLSM monitor provides the ability to monitor SLSM states and C2C link speed simultaneously across the two link partners of a C2C link serially using just two GPIOs. Since the SLSM status updates are provided using a single GPIO per side—as compared to a whole bus—this saves valuable real estate on the substrate that would otherwise be occupied by signal traces.

Because there can be an SLSM monitor on each end of a C2C link, both sides of the C2C link can be monitored and debugged simultaneously, which can result in a significant test time reduction. By the same principle, multiple C2C links can be monitored and debugged simultaneously, providing a further reduction in test time. Alternatively, sets of C2C links from a chiplet to one or more other chiplets may be monitored in turn using the same GPIO pin on the same chiplet. For example, a link from chiplet A to chiplet B may be monitored using a GPIO pin on chiplet A, then a link from chiplet A to chiplet C may be monitored using the same GPIO pin on chiplet A, and so on. Alternatively, one GPIO pin on chiplet A may be used to monitor the C2C link with chiplet B while another GPIO pin on chiplet A may be used to monitor the C2C link with chiplet C, etc.

Another advantage to the on-die SLSM monitor disclosed herein is that it enables real time capture of link state information. Conventional methods, such as monitoring of control and status registers (CSR), or determining statistics through firmware, do not allow real time monitoring. Real time monitoring is critical for debugging transient events, which can influence platform design as well as power distribution network (PDN) and package characteristics.

For example, in some aspects, the time spent in each SLSM state provides a quantifiable means to fine tune various CSR registers of the C2C PHY. In some aspects, adaptive feedback to the PHY optimization loop is used to improve initialization and boot time on the fly. In some aspects, such adaptive feedback is deployed as a self-correcting feature over life of product. Moreover, improving boot time and latency has a direct impact on power-to-performance metrics, which can be a key product differentiator. Optimization of link initialization based on information provided by the on-die SLSM monitor is useful in applications which have stringent operational times such as autonomous drive link up, where vehicles need to be operational in a few seconds, as well as in critical cloud infrastructure solutions. Another benefit to a customer is that, with the on-die SLSM monitor disclosed herein, LTSMM states can be monitors on customer premises during bring-up, using an inexpensive logic analyzer—there is no requirement to maintain engineering-intensive firmware images for performing logic analyzer functions, for example.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A method of on-die monitoring of C2C serial link state, the method comprising: detecting a change of a link state of the C2C serial link from a first link state to a second link state; storing, in an on-die FIFO buffer, link state change information, the link state change information comprising information indicating the first link state, a duration of time that the C2C serial link was in the first link state, and a speed of the C2C serial link in the first link state; detecting a request for link state change information; retrieving link state change information from the FIFO buffer; and transmitting the link state change information serially to an output pin.

Clause 2. The method of clause 1, wherein storing information indicating the duration of time the C2C serial link was in the first link state comprises storing information indicating how many clock cycles the C2C serial link was in the first link state.

Clause 3. The method of any of clauses 1 to 2, wherein transmitting the link state change information to the output pin comprises transmitting the link state change information to a GPIO pin.

Clause 4. The method of any of clauses 1 to 3, wherein transmitting the link state change information serially to the output pin comprises transmitting at least one of: one or more bits indicating that the link state change information is valid; one or more bits indicating a core clock rate; one or more bits indicating a status of the link state change information; one or more bits indicating a link state; or one or more bits indicating a duration of time that the C2C serial link was in the link state.

Clause 5. The method of any of clauses 1 to 4, wherein detecting the change of link state of the C2C serial link comprises detecting the change of the link state of a PCIE protocol link and wherein storing information indicating the first link state comprises storing information indicating a PCIE LTSSM state or substate.

Clause 6. An apparatus for on-die monitoring of C2C serial link training status and link state, the apparatus comprising: a die, comprising: a C2C serial link circuit comprising: a physical layer configured to transmit and receive data via a C2C serial link according to a C2C communication protocol; a SLSM configured to perform link training of the C2C serial link; and a SLSM monitor coupled to the SLSM and configured to: detect a change of a link state of the C2C serial link from a first link state to a second link state; store, in an on-die FIFO buffer, link state change information, the link state change information comprising information indicating the first link state, a duration of time the C2C serial link was in the first link state, and a speed of the C2C serial link in the first link state; detect a request for link state change information; retrieve link state change information from the FIFO buffer; and transmit the link state change information serially to an output pin of the die.

Clause 7. The apparatus of clause 6, wherein, to store information indicating the duration of time the C2C serial link was in the first link state, the SLSM monitor is configured to store information indicating how many clock cycles the C2C serial link was in the first link state.

Clause 8. The apparatus of any of clauses 6 to 7, wherein, to transmit the link state change information to the output pin of the die, the SLSM monitor is configured to transmit the link state change information to a GPIO pin.

Clause 9. The apparatus of any of clauses 6 to 8, wherein, to transmit the link state change information serially to the output pin, the SLSM monitor is configured to transmit at least one of: one or more bits indicating that the link state change information is valid; one or more bits indicating a core clock rate; one or more bits indicating a status of the link state change information; one or more bits indicating a link state; or one or more bits indicating a duration of time that the C2C serial link was in the link state.

Clause 10. The apparatus of any of clauses 6 to 9, wherein the C2C communication protocol comprises a PCIE protocol and wherein the serial link state machine comprises a PCIE LTSSM, and wherein the information indicating the first link state comprises information indicating an LTSSM state or substate.

Clause 11. An apparatus, comprising: means for detecting a change of a link state of a C2C serial link from a first link state to a second link state; means for storing, in an on-die FIFO buffer, link state change information, the link state change information comprising information indicating the first link state, a duration of time that the C2C serial link was in the first link state, and a speed of the C2C serial link in the first link state; means for detecting a request for link state change information; means for retrieving link state change information from the FIFO buffer; and means for transmitting the link state change information serially to an output pin.

Clause 12. The apparatus of clause 11, wherein the means for storing the information indicating the duration of time the C2C serial link was in the first link state comprises means for storing information indicating how many clock cycles the C2C serial link was in the first link state.

Clause 13. The apparatus of any of clauses 11 to 12, wherein the means for transmitting the link state change information to the output pin comprises means for transmitting the link state change information to a GPIO pin.

Clause 14. The apparatus of any of clauses 11 to 13, wherein the means for transmitting the link state change information serially to the output pin comprises means for transmitting at least one of: one or more bits indicating that the link state change information is valid; one or more bits indicating a core clock rate; one or more bits indicating a status of the link state change information; one or more bits indicating a link state; or one or more bits indicating a duration of time that the C2C serial link was in the link state.

Clause 15. The apparatus of any of clauses 11 to 14, wherein detecting the change of link state of the C2C serial link comprises detecting the change of the link state of a PCIE protocol link and wherein storing information indicating the first link state comprises storing information indicating a PCIE LTSSM state or substate.

Clause 16. A non-transitory computer-readable medium storing computer-executable instructions that, when executed by an apparatus, cause the apparatus to: detect a change of a link state of a C2C serial link from a first link state to a second link state; store, in an on-die FIFO buffer, link state change information, the link state change information comprising information indicating the first link state, a duration of time that the C2C serial link was in the first link state, and a speed of the C2C serial link in the first link state; detect a request for link state change information; retrieve link state change information from the FIFO buffer; and transmit the link state change information serially to an output pin.

Clause 17. The non-transitory computer-readable medium of clause 16, wherein the computer-executable instructions that, when executed by the apparatus, cause the apparatus to store information indicating the duration of time the C2C serial link was in the first link state comprise computer-executable instructions that, when executed by the apparatus, cause the apparatus to store information indicating how many clock cycles the C2C serial link was in the first link state.

Clause 18. The non-transitory computer-readable medium of any of clauses 16 to 17, wherein the computer-executable instructions that, when executed by the apparatus, cause the apparatus to transmit the link state change information to the output pin comprise computer-executable instructions that, when executed by the apparatus, cause the apparatus to transmit the link state change information to a GPIO pin.

Clause 19. The non-transitory computer-readable medium of any of clauses 16 to 18, wherein the computer-executable instructions that, when executed by the apparatus, cause the apparatus to transmit the link state change information serially to the output pin comprise computer-executable instructions that, when executed by the apparatus, cause the apparatus to transmit at least one of: one or more bits indicating that the link state change information is valid; one or more bits indicating a core clock rate; one or more bits indicating a status of the link state change information; one or more bits indicating a link state; or one or more bits indicating a duration of time that the C2C serial link was in the link state.

Clause 20. The non-transitory computer-readable medium of any of clauses 16 to 19, wherein detecting the change of link state of the C2C serial link comprises detecting the change of the link state of a PCIE protocol link and wherein storing information indicating the first link state comprises storing information indicating a PCIE LTSSM state or substate.

Clause 21. An apparatus comprising a memory, a transceiver, and a processor communicatively coupled to the memory and the transceiver, the memory, the transceiver, and the processor configured to perform a method according to any of clauses 1 to 5.

Clause 22. An apparatus comprising means for performing a method according to any of clauses 1 to 5.

Clause 23. A non-transitory computer-readable medium storing computer-executable instructions, the computer-executable comprising at least one instruction for causing a computer or processor to perform a method according to any of clauses 1 to 5.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A method of on-die monitoring of chip-to-chip (C2C) serial link state, the method comprising:
   at an on-die C2C serial link state machine monitoring circuit for monitoring a serial link state machine for communicating via a C2C serial link according to a C2C protocol:
   detecting a change of a link state of the C2C serial link from a first link state to a second link state;
   storing, in an on-die first-in, first-out (FIFO) buffer, link state change information, the link state change information comprising information indicating the first link state, a duration of time that the C2C serial link was in the first link state, and a speed of the C2C serial link in the first link state, wherein storing information indicating the duration of time the C2C serial link was in the first link state comprises storing information indicating how many clock cycles the C2C serial link was in the first link state;
   detecting the duration of time that the speed of C2C serial link in the first state exceeding an overflow condition and setting the information indicating how many clock cycles the C2C serial link was in the first link state to a configurable value;
   detecting a request for link state change information;
   retrieving link state change information from the FIFO buffer; and
   transmitting the link state change information serially to an output pin of the die.

2. The method of claim 1, wherein transmitting the link state change information to the output pin comprises transmitting the link state change information to a general purpose input/output (GPIO) pin.

3. The method of claim 1, wherein transmitting the link state change information serially to the output pin comprises transmitting at least one of:
- one or more bits indicating that the link state change information is valid;
- one or more bits indicating a core clock rate;
- one or more bits indicating a status of the link state change information;
- one or more bits indicating a link state; or
- one or more bits indicating a duration of time that the C2C serial link was in the link state.

4. The method of claim 1, wherein detecting the change of link state of the C2C serial link comprises detecting the change of the link state of a peripheral component interconnect express (PCIE) protocol link and wherein storing information indicating the first link state comprises storing information indicating a PCIE link training status and state machine (LTSSM) state or sub state.

5. An apparatus for on-die monitoring of chip-to-chip (C2C) serial link training status and link state, the apparatus comprising:
- a die, comprising:
  - a C2C serial link circuit comprising:
    - a physical layer configured to transmit and receive data via a C2C serial link according to a C2C communication protocol;
    - a serial link state machine (SLSM) configured to perform link training of the C2C serial link; and
    - a SLSM monitor coupled to the SLSM and configured to:
      - detect a change of a link state of the C2C serial link from a first link state to a second link state;
      - store, in an on-die first-in, first-out (FIFO) buffer, link state change information, the link state change information comprising information indicating the first link state, a duration of time the C2C serial link was in the first link state, and a speed of the C2C serial link in the first link state, wherein the information indicating the duration of time the C2C serial link was in the first link state comprises information indicating how many clock cycles the C2C serial link was in the first link state; detect the duration of time that the speed of C2C serial link in the first state exceeding an overflow condition and set the information indicating how many clock cycles the C2C serial link was in the first link state to a configurable value;
      - detect a request for link state change information;
      - retrieve link state change information from the FIFO buffer; and
      - transmit the link state change information serially to an output pin of the die.

6. The apparatus of claim 5, wherein, to transmit the link state change information to the output pin of the die, the SLSM monitor is configured to transmit the link state change information to a general purpose input/output (GPIO) pin.

7. The apparatus of claim 5, wherein, to transmit the link state change information serially to the output pin, the SLSM monitor is configured to transmit at least one of:
- one or more bits indicating that the link state change information is valid;
- one or more bits indicating a core clock rate;
- one or more bits indicating a status of the link state change information;
- one or more bits indicating a link state; or
- one or more bits indicating a duration of time that the C2C serial link was in the link state.

8. The apparatus of claim 5, wherein the C2C communication protocol comprises a peripheral component interconnect express (PCIE) protocol and wherein the serial link state machine comprises a PCIE link training status and link state machine (LTSSM), and wherein the information indicating the first link state comprises information indicating an LTSSM state or sub state.

9. An apparatus, comprising:
- at an on-die C2C serial link state machine monitoring circuit for monitoring a serial link state machine for communicating via a C2C serial link according to a C2C protocol:
  - means for detecting a change of a link state of the C2C serial link from a first link state to a second link state;
  - means for storing, in an on-die first-in, first-out (FIFO) buffer, link state change information, the link state change information comprising information indicating the first link state, a duration of time that the C2C serial link was in the first link state, and a speed of the C2C serial link in the first link state, wherein the information indicating the duration of time the C2C serial link was in the first link state comprises information indicating how many clock cycles the C2C serial link was in the first link state;
  - means for detecting the duration of time that the speed of C2C serial link in the first state exceeding an overflow condition and setting the information indicating how many clock cycles the C2C serial link was in the first link state to a configurable value;
  - means for detecting a request for link state change information;
  - means for retrieving link state change information from the FIFO buffer; and
  - means for transmitting the link state change information serially to an output pin of the die.

10. The apparatus of claim 9, wherein the means for transmitting the link state change information to the output pin comprises means for transmitting the link state change information to a general purpose input/output (GPIO) pin.

11. The apparatus of claim 9, wherein the means for transmitting the link state change information serially to the output pin comprises means for transmitting at least one of:
- one or more bits indicating that the link state change information is valid;
- one or more bits indicating a core clock rate;
- one or more bits indicating a status of the link state change information;
- one or more bits indicating a link state; or
- one or more bits indicating a duration of time that the C2C serial link was in the link state.

12. The apparatus of claim 9, wherein detecting the change of link state of the C2C serial link comprises detecting the change of the link state of a peripheral component interconnect express (PCIE) protocol link and wherein storing information indicating the first link state comprises storing information indicating a PCIE link training status and state machine (LTSSM) state or sub state.

13. A non-transitory computer-readable medium storing computer-executable instructions that, when executed by an apparatus, cause the apparatus to:

at an on-die C2C serial link state machine monitoring circuit for monitoring a serial link state machine for communicating via a C2C serial link according to a C2C protocol:
- detect a change of a link state of the C2C serial link from a first link state to a second link state;
- store, in an on-die first-in, first-out (FIFO) buffer, link state change information, the link state change information comprising information indicating the first link state, a duration of time that the C2C serial link was in the first link state, and a speed of the C2C serial link in the first link state, wherein the information indicating the duration of time that the C2C serial link was in the first link state comprises information indicating how many clock cycles the C2C serial link was in the first link state;

detecting the duration of time that the speed of C2C serial link in the first state exceeding an overflow condition and setting the information indicating how many clock cycles the C2C serial link was in the first link state to a configurable value;

detecting a request for link state change information;

retrieving link state change information from the FIFO buffer; and transmitting the link state change information serially to an output pin.

14. The non-transitory computer-readable medium of claim 13, wherein the computer-executable instructions that, when executed by the apparatus, cause the apparatus to transmit the link state change information to the output pin comprise computer-executable instructions that, when executed by the apparatus, cause the apparatus to transmit the link state change information to a general purpose input/output (GPIO) pin.

15. The non-transitory computer-readable medium of claim 13, wherein the computer-executable instructions that, when executed by the apparatus, cause the apparatus to transmit the link state change information serially to the output pin comprise computer-executable instructions that, when executed by the apparatus, cause the apparatus to transmit at least one of:
- one or more bits indicating that the link state change information is valid;
- one or more bits indicating a core clock rate;
- one or more bits indicating a status of the link state change information;
- one or more bits indicating a link state; or
- one or more bits indicating a duration of time that the C2C serial link was in the link state.

16. The non-transitory computer-readable medium of claim 13, wherein detecting the change of link state of the C2C serial link comprises detecting the change of the link state of a peripheral component interconnect express (PCIE) protocol link and wherein storing information indicating the first link state comprises storing information indicating a PCIE link training status and state machine (LTSSM) state or sub state.

* * * * *